United States Patent
Shekhar et al.

(10) Patent No.: US 10,756,753 B2
(45) Date of Patent: Aug. 25, 2020

(54) DATA COMPRESSOR LOGIC CIRCUIT

(71) Applicant: Arm Limited, Cambridge (GB)

(72) Inventors: Shardendu Shekhar, Austin, TX (US);
Andy Wangkun Chen, Austin, TX
(US); Yew Keong Chong, Austin, TX
(US)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 16/170,723

(22) Filed: Oct. 25, 2018

(65) Prior Publication Data
US 2020/0136643 A1    Apr. 30, 2020

(51) Int. Cl.
  *G06F 7/50*     (2006.01)
  *H03K 19/21*    (2006.01)
  *H03M 7/00*     (2006.01)
  *H03K 19/20*    (2006.01)
  *H03M 7/30*     (2006.01)
  *H03K 19/0944*  (2006.01)

(52) U.S. Cl.
  CPC ........ *H03M 7/005* (2013.01); *H03K 19/0944*
      (2013.01); *H03K 19/20* (2013.01); *H03K
      19/215* (2013.01); *H03M 7/6011* (2013.01)

(58) Field of Classification Search
  None
  See application file for complete search history.

(56) References Cited

U.S. PATENT DOCUMENTS

| | | | | |
|---|---|---|---|---|
| 3,767,906 A * | 10/1973 | Pryor | ...................... | G06F 7/503 |
| | | | | 708/230 |
| 5,224,065 A * | 6/1993 | Yoshida | .................. | G06F 7/503 |
| | | | | 708/707 |
| 5,473,559 A * | 12/1995 | Makino | ................. | G06F 7/4824 |
| | | | | 708/620 |
| 6,266,757 B1 * | 7/2001 | Desai | ...................... | G06F 7/509 |
| | | | | 711/220 |
| 2005/0027777 A1 * | 2/2005 | Rhee | ....................... | G06F 7/607 |
| | | | | 708/670 |

OTHER PUBLICATIONS

Elrabaa; A New Static Differential CMOS Logic with Superior Low Power Performance; Analog Integrated Circuits and Signal Processing; No. 43, pp. 183-190; Springer Science + Business Media, Inc.; 2005.
Goel, et al.; Novel Design Methodology for High-Performance XOR-XNOR Circuit Design; Proceedings of the 16th Symposium on Integrated Circuits and Systems Design (SBCCI'03); IEEE; 2003.

* cited by examiner

*Primary Examiner* — Anh Q Tran
(74) *Attorney, Agent, or Firm* — Pramudji Law Group PLLC; Ari Pramudji

(57) ABSTRACT

A compressor includes a logic circuit having transistors of a first channel type to receive a plurality of bit signals, and transistors of a second channel type, different from the first channel type, to receive the plurality of bit signals. The transistors of the first channel type are configured to generate an XOR logic output based on the plurality of bit signals, and the transistors of the second channel type are configured to generate, substantially simultaneous with the generation of the XOR logic output, an XNOR logic output based on the plurality of bit signals. The compressor includes NAND gates to receive multiplicand and multiplier bit signals.

12 Claims, 4 Drawing Sheets

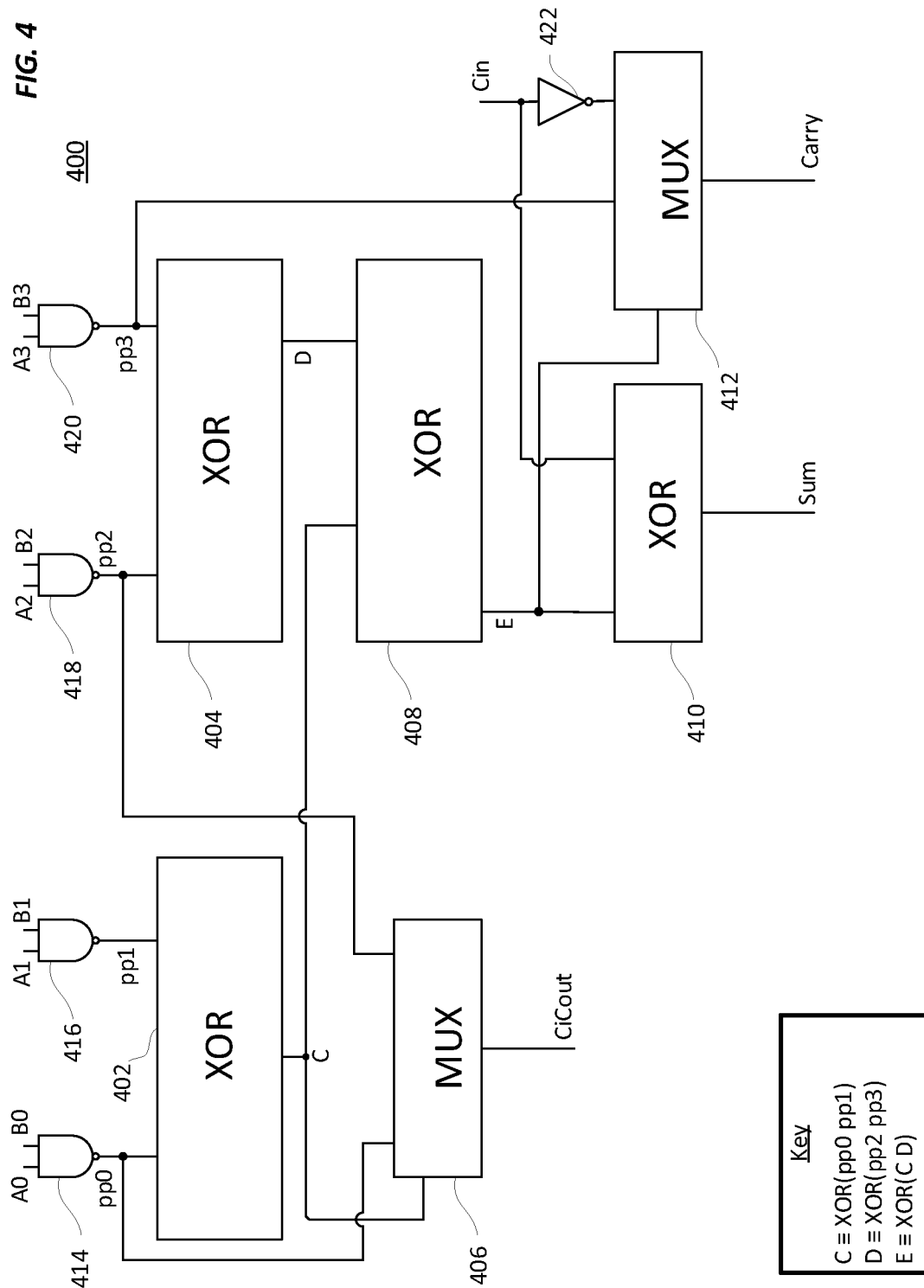

DATA COMPRESSOR LOGIC CIRCUIT

FIELD OF THE DISCLOSURE

The present disclosure relates in general to data compression and, more particularly, to logic circuits for use in data compressors.

BACKGROUND

Processing data, such as graphics and machine learning data, utilize computational resources such as multipliers and partial product adders. Data compression techniques are utilized in partial product adders to perform column addition operations in parallel, while keeping the sums separate from the carries. The product is realized by combining the final sum and carry using, as an example, normal addition.

Data compressors implement partial product reduction stages because they help reduce the partial products and they also reduce the critical path, which is desirable to maintain circuit performance. In a multiplier, partial product reduction trees may be implemented using XOR, half-adder, and full-adder gates, and may be the largest power consuming components. Moreover, the speed of data processing techniques may be adversely impacted by the rate at which partial product reduction occurs.

BRIEF DESCRIPTION OF THE DRAWINGS

Aspects of the present disclosure are best understood from the following detailed description when read with the accompanying figures. It is noted that, in accordance with standard practice in the industry, various features are not drawn to scale. In fact, the dimensions of the various features may appear arbitrarily increased or reduced for clarity of discussion.

FIG. 4 is an illustration of yet another embodiment of a data compressor of the present disclosure.

DETAILED DESCRIPTION

Figure 1:
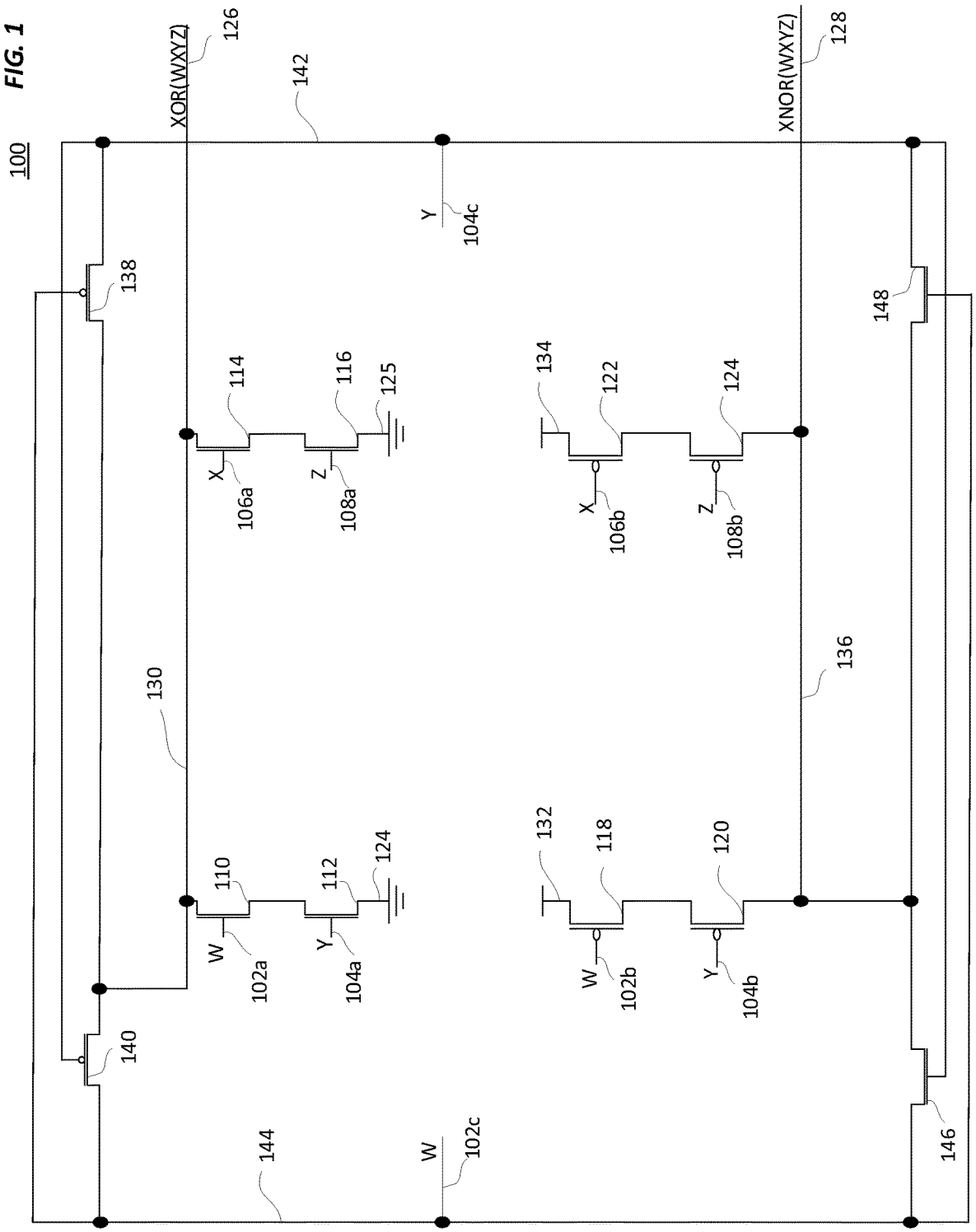
FIG. 1 is a schematic of an embodiment of an XOR-XNOR circuit of the present disclosure.

The following disclosure provides many different embodiments, and/or examples, for implementing different features of the provided subject matter. Specific examples of components and arrangements are described below to simplify the present disclosure. These are, of course, merely examples and are not intended to be limiting. For example, the location of a first feature near or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate, unless otherwise noted, a relationship between the various embodiments and/or configurations discussed.

FIG. 1 is a schematic of an embodiment of an XOR-XNOR circuit 100 of the present disclosure. The XOR-XNOR circuit 100 may be used in embodiments of compressor circuits having a partial product generator.

The XOR-XNOR circuit 100 of the embodiment of FIG. 1 includes ten input terminals 102a, 102b, 102c, 104a, 104b, 104c, 106a, 106b, 108a, and 108b for receiving input data signals (also referred to as operands), and two output terminals 126 and 128 for providing output data signals. Terminals 102a, 102b, and 102c each receive the same input data signal, notated in FIG. 1 as "W" for clarity. Terminals 104a, 104b, and 104c each receive the same input data signal, notated in FIG. 1 as "Y." Terminals 106a and 106b each receive the same input data signal, notated in FIG. 1 as "X." Terminals 108a and 108b each receive the same input data signal, notated in FIG. 1 as "Z."

The XOR-XNOR circuit 100 is configured to perform XOR and XNOR operations on input data signals W, X, Y, and Z, and provide logic output signals XOR(WXYZ) and XNOR(WXYZ). For any given set of input signals, XNOR(WXYZ) will be the logic complement of XOR(WXYZ). The detailed operation of the XOR-XNOR circuit 100 in generating logic output signals XOR(WXYZ) and XNOR(WXYZ) is discussed below.

The XOR-XNOR circuit 100 includes transistors 110 and 112 coupled in series between a conductor 130 and a reference node 124 carrying a reference potential, such as a ground voltage. The drain terminal of transistor 110 is coupled to conductor 130, and the source terminal is coupled to the drain terminal of transistor 112. The source terminal of transistor 112 is coupled to the reference node 124. In the illustrated embodiment, transistors 110 and 112 are n-channel MOSFETS. Conductor 130 may be electrically coupled to, or form part of, terminal 126.

The XOR-XNOR circuit 100 further includes transistors 114 and 116 coupled in series between conductor 130 and a reference node 125 carrying a reference potential, such as a ground voltage. In an embodiment, reference node 125 is electrically coupled to reference node 124, such that both nodes carry the same reference potential. The drain terminal of transistor 114 is coupled to conductor 130, and the source terminal of transistor 114 is coupled to the drain terminal of transistor 116. The source terminal of transistor 116 is coupled to the reference node 125. In the illustrated embodiment, transistors 114 and 116 may be n-channel MOSFETS. Alternatively, transistors 110, 112, 114, and 116 may be any other type of FET, such as, but not limited to, JFETs and FinFETs.

The XOR-XNOR circuit 100 further includes transistors 118 and 120 coupled in series between a voltage supply node 132 and a conductor 136. The source terminal of transistor 118 is coupled to the voltage supply node 132, and the drain terminal of transistor 118 is coupled to the source terminal of transistor 120. The drain terminal of transistor 120 is coupled to the conductor 136. In the illustrated embodiment, transistors 118 and 120 are p-channel MOSFETS. Conductor 136 may be electrically coupled to, or form part of, terminal 128.

The XOR-XNOR circuit 100 further includes transistors 122 and 124 coupled in series between voltage supply node 134 and conductor 136. In an embodiment, voltage supply node 132 is electrically coupled to voltage supply node 134, such that both nodes carry the same supply voltage potential. The source terminal of transistor 122 is coupled to the voltage supply node 134, and the drain terminal of transistor 122 is coupled to the source terminal of transistor 124. The drain terminal of transistor 124 is coupled to conductor 136. In the illustrated embodiment, transistors 122 and 124 may be p-channel MOSFETS. Alternatively, transistors 118, 120, 122, and 124 may be any other type of FET, such as, but not limited to, JFETs and FinFETs.

The XOR-XNOR circuit 100 further includes transistors 138 and 140 (also referred to as switches). In the illustrated embodiment, the drain terminal of transistor 138 is coupled to the drain terminal of transistor 140. The source terminal of transistor 138 is coupled to conductor 142, and the source terminal of transistor 140 is coupled to conductor 144. Conductor 142 may be electrically coupled to, or form part of, terminal 104c. Conductor 144 may be electrically coupled to, or form part of, terminal 102c.

In the illustrated embodiment, transistors 138 and 140 are p-channel MOSFETS. Alternatively, transistors 138 and 140 may be any other type of FET, such as, but not limited to, JFETs and FinFETs.

The XOR-XNOR circuit 100 further includes transistors 146 and 148 (also referred to as switches). In the illustrated embodiment, the source terminal of transistor 146 is coupled to the source terminal of transistor 148. The drain terminal of transistor 146 is coupled to conductor 144, and the drain terminal of transistor 148 is coupled to conductor 142. In the illustrated embodiment, transistors 146 and 148 are n-channel MOSFETS. Alternatively, transistors 146 and 148 may be any other type of FET, such as, but not limited to, JFETs and FinFETs.

In the illustrated embodiment, the drain terminals of transistors 138 and 140 are coupled to conductor 130, and the source terminals of transistors 146 and 148 are coupled to conductor 136.

Figure 3:
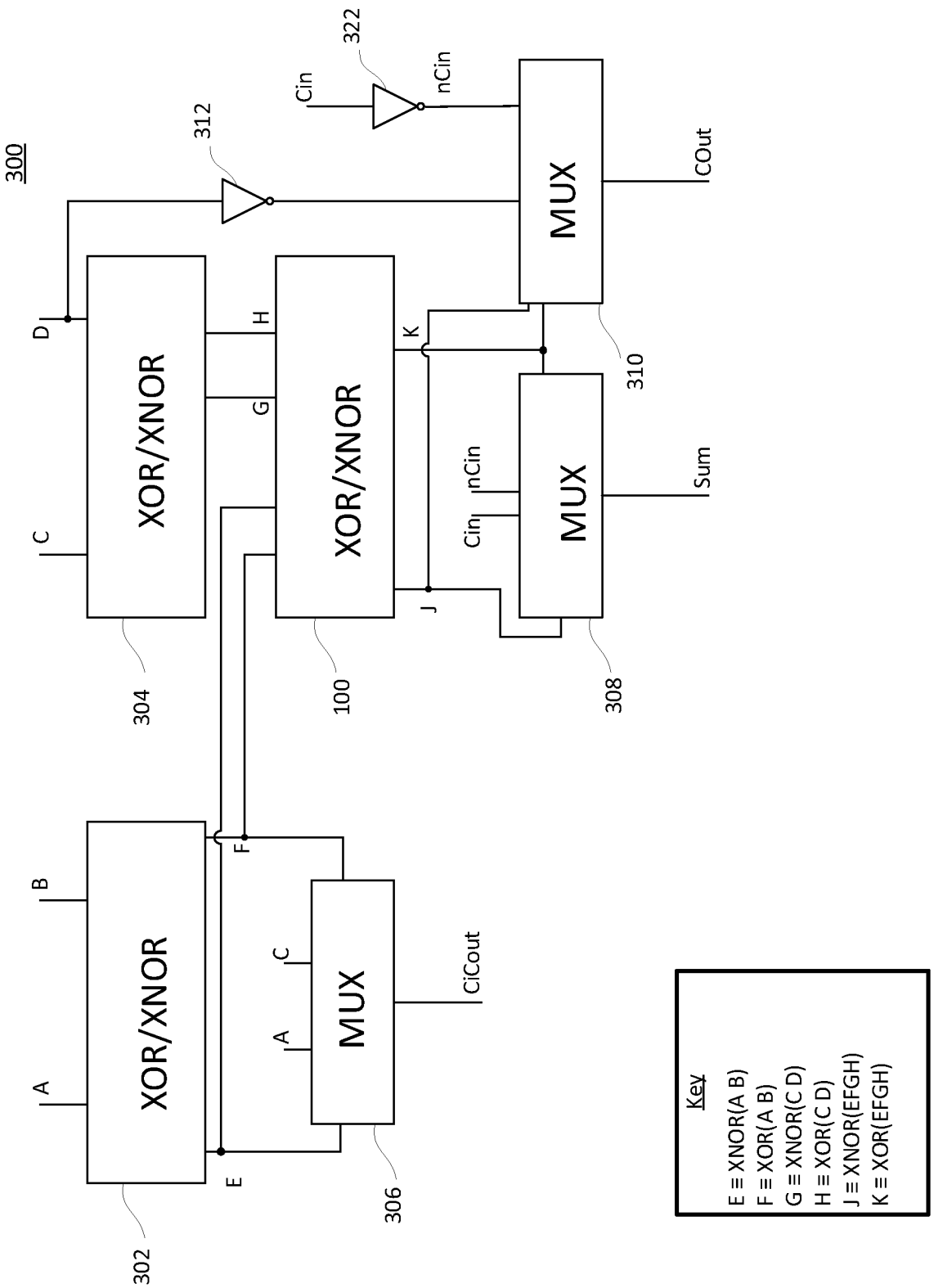
FIG. 3 is an illustration of another embodiment of a data compressor of the present disclosure.

The XOR-XNOR circuit 100, as illustrated, processes four input data signals W, X, Y, and Z, and generates output data signals XOR(WXYZ) and XNOR(WXYZ). Referring momentarily to FIG. 3 (discussed in detail below), a compressor cell 300 includes XOR-XNOR circuit 100. As illustrated in FIG. 3, XOR-XNOR circuit 100 receives four input data signals E, F, G and H. Input data signals E, F, G and H of FIG. 3 correspond to, respectively, input data signals W, X, Y, and Z of FIG. 1. With reference to the Key of FIG. 3, it is apparent that signal E is the complement of signal F, and signal G is the complement of signal H. Correspondingly, (with reference to FIG. 1), signal W is the complement of signal X, and signal Y is the complement of signal Z. Table 1 shows the possible input bit combinations to XOR-XNOR circuit 100 when implemented in the compressor cell 300 of FIG. 3.

TABLE 1

Input bit combinations of XOR-XNOR circuit 100, and XOR/XNOR outputs.

| Inputs | | | | Outputs | |
|---|---|---|---|---|---|
| W | X | Y | Z | XOR(WXYZ) | XNOR(WXYZ) |
| 0 | 1 | 0 | 1 | 0 | 1 |
| 0 | 1 | 1 | 0 | 1 | 0 |
| 1 | 0 | 0 | 1 | 1 | 0 |
| 1 | 0 | 1 | 0 | 0 | 1 |

For example, with reference to FIG. 1, XOR(WXYZ)=0 whenever W=Y=1 or X=Z=1, because transistors 110/112 or 114/116 switch to a closed state, effectively shorting conductor 130 to ground. However, if W≠Y and X≠Z, the output XOR(WXYZ) corresponds to whether W=0 (thus closing transistor 138) or Y=0 (thus closing transistor 140). If transistor 138 is closed, XOR(WXYZ)=W. If transistor 140 is closed, XOR(WXYZ)=Y. The XNOR(WXYZ) output is similarly determined by the states of transistors 118, 120, 122, 124, 146, and 148, based on input data signals W, X, Y, and Z.

Consequently, the states of XOR(WXYZ) and XNOR(WXYZ) are determined in parallel, rather than in series or through an inverter. By processing the XOR and XNOR operations in parallel, XOR-XNOR circuit 100 generates the output bit signals with less delay than XOR, XNOR, and XOR-XNOR configurations that utilize series processing and/or include an inverter to invert the XOR result (or, alternatively, invert the XNOR result). The present disclosure observes a 16.11% reduction in the average delay of the XOR/XNOR circuit 100 over a standard XOR based cell, and an 11.50% reduction in the maximum delay of the XOR/XNOR circuit 100 over a standard XOR based cell. Moreover, the present disclosure observes 5.02% reduction in power consumed by the XOR/XNOR circuit 100 over a standard XOR based cell.

Figure 2:
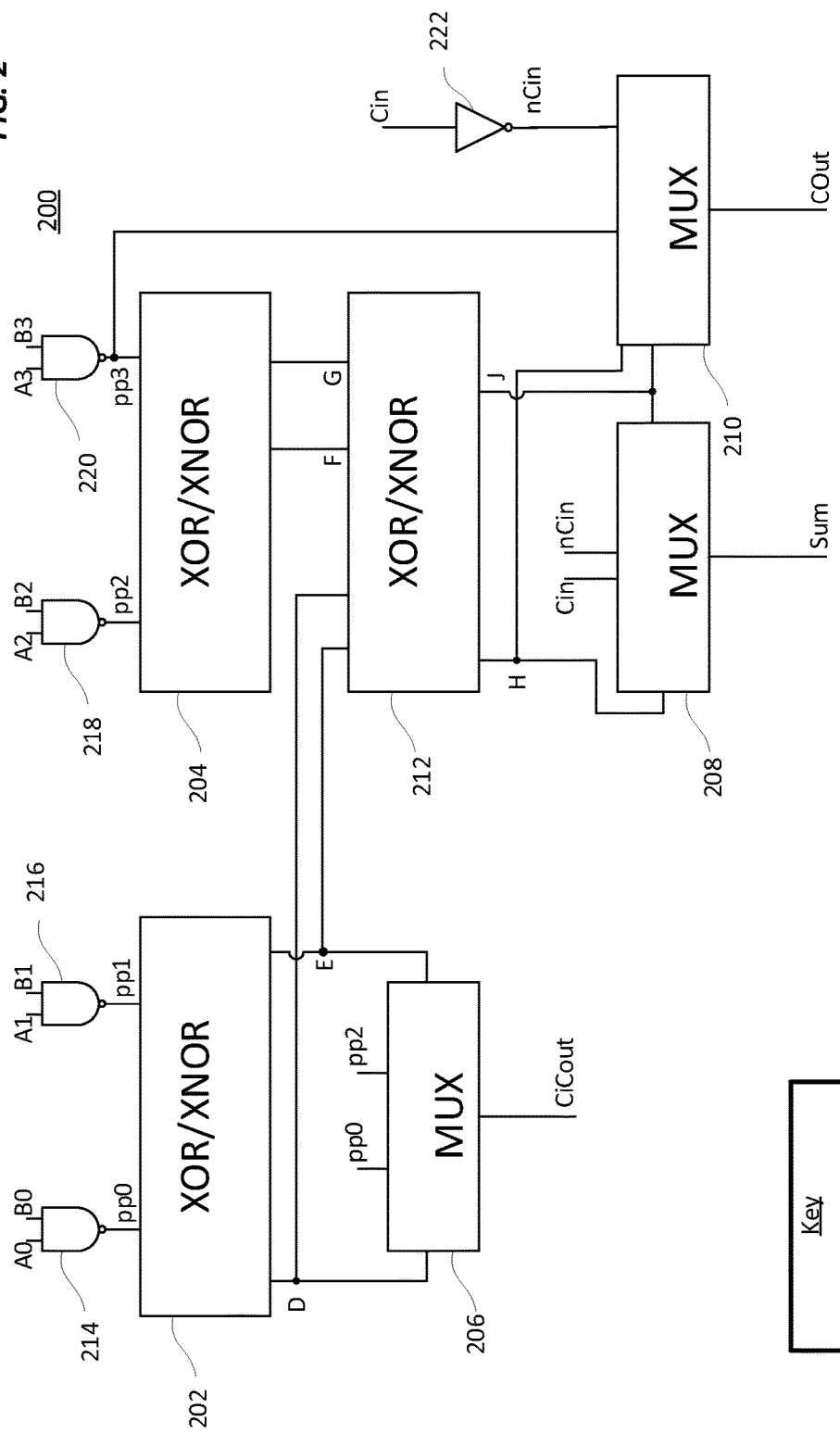
FIG. 2 is an illustration of an embodiment of a data compressor of the present disclosure.

Referring to FIG. 2, an embodiment of a compressor cell 200 includes an XOR/XNOR circuit 202, an XOR/XNOR circuit 204, an XOR/XNOR circuit 212, and multiplexers 206, 208, and 210. The XOR/XNOR circuits 202, 204, and 212 may have circuit configurations that are the same as, or different from, one another. For example, in an embodiment of the compressor cell 200, XOR/XNOR circuit 212 has the configuration of XOR/XNOR circuit 100 of FIG. 1, and the XOR/XNOR circuits 202 and 204 have configurations that are other than the configuration of XOR/XNOR circuit 100. Other configurations of XOR/XNOR circuits may be implemented in compressor cell 200.

The compressor cell 200 includes NAND gates 214, 216, 218, and 220. Each NAND gate has two input terminals for receiving respective multiplier and multiplicand bits. For example, in a four-bit multiplication operation of A·B, the multiplicand bits A may be represented as A0, A1, A2, and A3. The multiplier bits B may be represented as B0, B1, B2, and B3. In this example, NAND gate 214 receives bits A0 and B0, NAND gate 216 receives bits A1 and B1, NAND gate 218 receives bits A2 and B2, and NAND gate 220 receives bits A3 and B3. The output terminals of NAND gates 214 and 216 are coupled to XOR/XNOR circuit 202. The output terminals of NAND gates 218 and 220 are coupled to XOR/XNOR circuit 204.

The output signal of NAND gate 214 corresponds to the inverted Nth order bit in the first partial product (pp0), the output signal of NAND gate 216 corresponds to the inverted Nth order bit in the second partial product (pp1), the output signal of NAND gate 218 corresponds to the inverted Nth order bit in the third partial product (pp2), and the output signal of NAND gate 220 corresponds to the inverted Nth order bit in the fourth partial product (pp3). The "Nth order" corresponds to the Nth column (i.e., order of magnitude) of the partial products. Table 2 illustrates the partial products and Nth order placements.

TABLE 2

Illustration of correspondence among the Nth order compressors and the partial products.

| Multiplicand | | | | | | | |
|---|---|---|---|---|---|---|---|
| A3 | A2 | A1 | A0 | | | | |
| Multiplier | | | | | | | |
| B3 | B2 | B1 | B0 | | | | |
| 0 | 0 | 0 | B0A3 | B0A2 | B0A1 | B0A0 | pp0 |
| 0 | 0 | B1A3 | B1A2 | B1A1 | B1A0 | 0 | pp1 |
| 0 | B2A3 | B2A2 | B2A1 | B2A0 | 0 | 0 | pp2 |
| B3A3 | B2A2 | B3A1 | B3A0 | 0 | 0 | 0 | PP3 |
| $6^{th}$ order compressor | $5^{th}$ order compressor | $4^{th}$ order compressor | $3^{rd}$ order compressor | $2^{nd}$ order compressor | $1^{st}$ order compressor | $0^{th}$ order compressor | |

With reference to FIG. 2 and Table 2, a first compressor cell 200 corresponds to the $0^{th}$ order compressor in Table 2. The input data signals to the $0^{th}$ order compressor cell (a first compressor cell 200) correspond to the partial product bits in the A0/B0 column of Table 2. The input data signals to the $1^{st}$ order compressor cell (a second compressor cell 200) correspond to the partial product bits in the A1/B1 column of Table 2, and so on. The relationships among the compressors are best understood with reference to FIG. 2: the CiOut terminal (having the carry-out data signal) of an N order compressor is coupled to the Cin terminal (having the carry-in data signal) of an (N+1) order compressor.

As illustrated in FIG. 2, the carry-out data signal (CiCout) of the compressor cell 200 is either pp0 or pp2, depending on the states of complementary MUX control/selection signals D and E. As illustrated in FIG. 2, MUX control/selection signals D and E are data signals generated by XOR/XNOR circuit 202, based on input signals pp0 and pp1.

The sum data signal (Sum) of the compressor cell 200 is either Cin or nCin, depending on the states of complementary MUX control/selection signals H and J. As illustrated in FIG. 2, MUX control/selection signals H and J are data signals generated by XOR/XNOR circuit 212, based on input signals D, E, F, and G. As illustrated in FIG. 2, signals F and G are data signals generated by XOR/XNOR circuit 204, based on input signals pp2 and pp3.

As illustrated in FIG. 2, the carry data signal (COut) is either pp3 or nCin (inverted Cin by inverter 222), depending on the states of complementary MUX control selection signals H and J.

Multiple compressor cells 200 may be cascaded by providing the CiCout data signal of an Nth order compressor as the Cin data signal of an (N+1) order compressor. The respective Sum data signal output from each compressor cell will thus be the N order partial product bit sum, e.g., pp0+pp1+pp2+pp3.

As discussed above, the input signals pp0, pp1, pp2, and pp3 are each generated by a respective NAND gate 214, 216, 218, and 220. It has been observed by the authors of the present disclosure that generating the input signals pp0, pp1, pp2, and pp3 using respective NAND gates results in less diffusion in the input signals, thereby decreasing the likelihood of signal error origination and propagation that otherwise may occur in response to differences among the input signals as a consequence of diffusion.

FIG. 3 illustrates a compressor cell 300 having components similar to the components illustrated in FIG. 2. In FIG. 3, the reference numerals of components similar in type and location to those of FIG. 2 are increased by 100. However, unlike compressor cell 200, compressor cell 300 does not include NAND gates having output terminals coupled to the inputs of XOR/XNOR circuits 302 and 304. Rather, the partial product bits of each order are directly input into terminals A, B, C, and D. For example, with reference to Table 2, a third order compressor cell 300 receives data inputs pp0, pp1, pp2, and pp3 corresponding to the third order compressor column (A3/B3).

As illustrated in FIG. 3, the carry data signal (COut) is either the output signal of inverter 312 (inverted D) or nCin (inverted Cin by inverter 322), depending on the states of complementary MUX control selection signals J and K.

The XOR/XNOR circuits 100, 302, and 304 may have circuit configurations that are the same as, or different from, one another. For example, in an embodiment of the compressor cell 300, XOR/XNOR circuit 100 has the configuration of XOR/XNOR circuit 100 of FIG. 1, and the XOR/XNOR circuits 302 and 304 have configurations that are other than the configuration of XOR/XNOR circuit 100. Other configurations of XOR/XNOR circuits that may be implemented in compressor cell 300 include, but are not limited to, those described at pages 2-3 of the Goel et al. non-patent publication referenced above.

FIG. 4 illustrates a compressor cell 400. Unlike the compressor cells 200 and 300 of FIGS. 2 and 3, the compressor cell 400 does not include circuits that generate both XOR and XNOR data signals. Rather, the compressor cell 400 includes XOR circuits 402, 404, and 408. XOR circuit 402 includes two input terminals coupled to the output terminals of NAND gates 414 and 416. XOR circuit 404 includes two input terminals coupled to the output terminals of NAND gates 418 and 420. NAND gate 414 receives bits A0 and B0 and outputs pp0 (inverted partial product), NAND gate 416 receives bits A1 and B1 and outputs pp1 (inverted partial product), NAND gate 418 receives bits A2 and B2 and outputs pp2 (inverted partial product), and NAND gate 420 receives bits A3 and B3 and outputs pp3 (inverted partial product). Incorporating the respective NAND gates results in less diffusion in the input signals, thereby decreasing the likelihood of signal error origination and propagation that otherwise may occur in response to differences among the input signals as a consequence of diffusion.

As illustrated in FIG. 4, the carry-out data signal (CiCout) of the compressor cell 400 is either pp0 or pp2, depending on the state of MUX control/selection signal C. MUX control/selection signal C is a data signal generated by XOR circuit 402, based on input signals pp0 and pp1. The carry data signal (Carry) is either pp3 or inverted Cin (inverted by inverter 422), depending on the state of MUX control selection signal E. The sum data signal (Sum) of the compressor cell 400 is XOR(E Cin).

In some embodiments, any one or more of multiplexers 206, 210, 306, 310, 406, and/or 412 illustrated in FIGS. 2-4 are configured to output inverted CiCout, COut, or Carry signals. Further, any one or more of multiplexers 206, 210, 306, 310, 406, and/or 412 can be AND-OR-INVERT gate(s) that output inverted CiCout, COut, or Carry signals.

In one example configuration, there is a compressor, comprising: a first logic gate having a first input terminal, a second input terminal, and a first output terminal, the first logic gate being configured to perform a NAND logic operation on a first multiplicand bit and a first multiplier bit received at, respectively, the first and second input terminals, and to output a first partial product bit at the first output terminal; and a first circuit having a third input terminal electrically coupled to the first output terminal of the first logic gate, wherein the first circuit is configured to perform an XOR logic operation on the first partial product bit and a second partial product bit to generate a resultant XOR logic operation bit.

In another example configuration, there is a method, comprising: receiving a first multiplicand bit and a first multiplier bit; performing, with a first NAND circuit, a logic NAND operation on the first multiplicand bit and the first multiplier bit, to generate a first output bit; receiving a second multiplicand bit and a second multiplier bit; performing, with a second NAND circuit, a logic NAND operation on the second multiplicand bit and the second multiplier bit, to generate a second output bit; and performing a logic XOR operation with the first and second output bits to generate a first select signal.

In a yet further example configuration, there is a logic circuit, comprising: a first input terminal for receiving a first operand; a first switch having a gate terminal electrically coupled to the first input terminal; a first output terminal electrically coupled to a first terminal of the first switch; and a second input terminal for receiving a second operand, and wherein the second input terminal is electrically coupled to a second terminal of the first switch.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A compressor, comprising:
   first, second, and third logic gates each having respective first and second input terminals and an output terminal, wherein the first, second, and third logic gates are configured to output respective first, second, and third partial product bits at the respective output terminals;
   a first circuit having first and second input terminals electrically coupled to the respective output terminals of the first and second logic gates, wherein the first circuit is configured to perform an XOR or XNOR logic operation on the first partial product bit or the second partial product bit to generate a resultant respective XOR or XNOR logic operation bit corresponding to one or more select signals; and
   a first multiplexer having:
      a first multiplexer select input terminal electrically coupled to the first circuit, and
      a first multiplexer output terminal,
      wherein the first multiplexer is configured to select a carry-out bit from among at least the first partial product bit and a third partial product bit based on the one or more select signals received at the first multiplexer select input terminal.

2. The compressor of claim 1, wherein each of the first, second, and third logic gates is configured to perform a NAND logic operation on a respective multiplicand bit and a respective multiplier bit received at, the respective input terminals.

3. The compressor of claim 1, wherein the output terminal of the third logic gate is electrically coupled to a data terminal of the first multiplexer and to a second circuit, and further comprising:
   a fourth logic gate having an output terminal electrically coupled to the second circuit and to a second multiplexer,
   wherein the second multiplexer is configured to select and output a carry signal at a second multiplexer output terminal.

4. The compressor of claim 1, further comprising:
   a first multiplexer having a first data input terminal electrically coupled to the first output terminal of the first logic gate.

5. The compressor of claim 4, further comprising:
   a fourth logic gate having a output terminal electrically coupled to a second circuit and to a second multiplexer, and
   wherein the output terminal of the third logic gate is electrically coupled to a second data input terminal of the first multiplexer and to the second circuit, and wherein the second multiplexer is configured to select and output a carry signal at a second multiplexer output terminal.

6. A method, comprising:
   receiving a first multiplicand bit and a first multiplier bit;
   performing, with a first NAND circuit, a logic NAND operation on the first multiplicand bit and the first multiplier bit, to generate a first output bit;
   receiving a second multiplicand bit and a second multiplier bit;
   performing, with a second NAND circuit, a logic NAND operation on the second multiplicand bit and the second multiplier bit, to generate a second output bit;
   performing a logic XOR operation with the first and second output bits to generate a first select signal;
   receiving a third multiplicand bit and a third multiplier bit;
   performing, with a third NAND circuit, a logic NAND operation on the third multiplicand bit and the third multiplier bit, to generate a third output bit; and
   selecting, at the multiplexer, a carry-out bit from among the first output bit and the third output bit based on the state of the first select signal.

7. The method of claim 6, further comprising:
   performing, substantially simultaneously with the logic XOR operation, a logic XNOR operation with the first and second output bits to generate a second select signal, and selecting, at the multiplexer, a carry-out bit from the first output bit and the third output bit based on the states of the first and second select signals.

8. A compressor, comprising:
a first circuit having pairs of first and second partial product bits coupled to corresponding first and second input terminals of the first circuit, wherein the first circuit is configured to perform an XOR or XNOR logic operation on the first partial product bit or the second partial product bit to generate a resultant respective XOR or XNOR logic operation bit corresponding to one or more first select signals; and
a second circuit having pairs of third and fourth partial product bits coupled to corresponding first and second input terminals of the second circuit, wherein the second circuit is configured to perform an XOR or XNOR logic operation on the third partial product bit or the fourth partial product bit to generate a resultant respective XOR or XNOR logic operation bit corresponding to one or more second select signals.

9. The compressor of claim 8, wherein the first and third partial product bits are electrically coupled to first and second data terminals of a first multiplexer, wherein the first multiplexer is configured to select a carry-out bit from among at least the first partial product bit and a third partial product bit based on the one or more first select signals received at the first multiplexer.

10. The compressor of claim 8, wherein the fourth partial product bit is electrically coupled to the second circuit and to a second multiplexer, and wherein the second multiplexer is configured to select and output a carry data signal at a second multiplexer output terminal.

11. A compressor, comprising:
a first circuit having one or more of first and second partial product bits input on first and second input terminals of the first circuit, wherein the first circuit is configured to perform an XOR or XNOR logic operation on the first partial product bit or the second partial product bit to generate a resultant respective XOR or XNOR logic operation bit corresponding to one or more first select signals; and
a second circuit having one or more of third and fourth partial product bits input on first and second input terminals of the second circuit, wherein the second circuit is configured to perform an XOR or XNOR logic operation on the third partial product bit or the fourth partial product bit to generate a resultant respective XOR or XNOR logic operation bit corresponding to one or more second select signals;
wherein the first, second, third, and fourth partial product bits correspond to respective outputs of first, second, third, and fourth logic gates, wherein each logic gate comprises respective first and second input terminals and an output terminal.

12. The compressor of claim 11, wherein the first circuit comprises first and second input terminals electrically coupled to the output terminals of the first and second logic gates, and wherein the second circuit comprises first and second input terminals electrically coupled to the output terminals of the third and fourth logic gates.

* * * * *